(12) United States Patent
Yuan et al.

(10) Patent No.: US 8,344,313 B2
(45) Date of Patent: Jan. 1, 2013

(54) OPTICAL INPUT TYPE TOUCH SYSTEM AND FEEDBACK CONTROL METHOD THEREOF

(75) Inventors: Chih-Ming Yuan, Hsinchu (TW); Shen-Tai Liaw, Hsinchu (TW); Naejye Hwang, Hsinchu (TW); Sen-Shyong Fann, Hsinchu (TW)

(73) Assignee: Integrated Digital Technologies, Inc., Hsinchu (TW)

( * ) Notice: Subject to any disclaimer, the term of this patent is extended or adjusted under 35 U.S.C. 154(b) by 98 days.

(21) Appl. No.: 12/899,349

(22) Filed: Oct. 6, 2010
(Under 37 CFR 1.47)

(65) Prior Publication Data
US 2011/0018834 A1  Jan. 27, 2011

Related U.S. Application Data

(63) Continuation-in-part of application No. 11/777,887, filed on Jul. 13, 2007, now Pat. No. 7,960,679, which is a continuation-in-part of application No. 11/534,680, filed on Sep. 25, 2006, now Pat. No. 7,525,078.

(30) Foreign Application Priority Data

Oct. 17, 2005  (TW) ................................. 94135169 A

(51) Int. Cl.
*G01J 1/36* (2006.01)
*H05B 37/02* (2006.01)
*G06M 7/00* (2006.01)

(52) U.S. Cl. ............... 250/227.22; 250/214 AL; 250/221

(58) Field of Classification Search ............... 345/173, 345/175, 176, 178, 180; 250/221, 549, 214 R, 250/214.1, 214 AG, 214 AL, 214 C, 214 DC, 250/227.22; 178/18.01, 18.03, 18.09, 18.11
See application file for complete search history.

(56) References Cited

U.S. PATENT DOCUMENTS

| 4,988,983 | A | 1/1991 | Wehrer |
| 5,262,635 | A | 11/1993 | Curbelo |
| 6,081,558 | A | 6/2000 | North |
| 7,002,547 | B2 | 2/2006 | Yamada |
| 7,009,663 | B2 * | 3/2006 | Abileah et al. .................. 349/12 |

(Continued)

FOREIGN PATENT DOCUMENTS

JP  2002-297096  * 9/2002

OTHER PUBLICATIONS

Destura, et al.; "Novel Touch Sensible In-Cell;" AMLCD SID 04 Digest (2004); 3.5; 22-23.

(Continued)

*Primary Examiner* — Pascal M Bui Pho
(74) *Attorney, Agent, or Firm* — McClure, Qualey & Rodack, LLP

(57) ABSTRACT

A touch system including a touch panel and a readout circuit is disclosed. The touch panel is integrated with a plurality of photosensitive elements within pixel elements, and capable of displaying at least touch position by at least an optical inputting. The touch panel provides a signal data when the touch panel is touched. The readout circuit is configured to receive the signal data and includes a transformation unit and a processing unit. The transformation unit generates a signal value based on the signal data and a transformation parameter. The processing unit executes a specific action when the signal value is less than a preset value.

16 Claims, 6 Drawing Sheets

U.S. PATENT DOCUMENTS

| | | |
|---|---|---|
| 7,030,360 B2 | 4/2006 | Shimizu et al. |
| 2003/0156087 A1 | 8/2003 | Boer et al. |
| 2003/0156230 A1 | 8/2003 | Boer et al. |
| 2003/0234759 A1* | 12/2003 | Bergquist .................. 345/92 |
| 2006/0111604 A1 | 5/2006 | Petrakis et al. |
| 2006/0262055 A1 | 11/2006 | Takahara |
| 2006/0267948 A1 | 11/2006 | Takahashi |
| 2006/0274056 A1 | 12/2006 | Saravanan et al. |
| 2007/0257890 A1 | 11/2007 | Hotelling et al. |
| 2010/0309650 A1* | 12/2010 | Yoshimoto ................ 362/97.2 |

OTHER PUBLICATIONS

Abileah, et al; "Integrate Optical Touch Panel in a 14.1;" AMLCD; SID 04 Digest (2004); 59.3; 1544-1547.

* cited by examiner

__US 8,344,313 B2__

OPTICAL INPUT TYPE TOUCH SYSTEM AND FEEDBACK CONTROL METHOD THEREOF

CROSS REFERENCE TO RELATED APPLICATIONS

This application is a continuation in part (CIP) application of and claims the priority benefit of patent application Ser. No. 11/777,887, filed on Jul. 13, 2007. The prior patent application Ser. No. 11/777,887 is a continuation in part (CIP) application of and claims the priority benefit of patent application Ser. No. 11/534,680, filed on Sep. 25, 2006, which has been patented as U.S. Pat. No. 7,525,078 on Apr. 28, 2009. The prior patent application Ser. No. 11/534,680 also claims the priority benefit of Taiwan application No. 94135169, filed on Oct. 17, 2005. The entirety of each of the above-mentioned applications is hereby incorporated by reference herein and made a part of this specification.

BACKGROUND OF THE INVENTION

1. Field of the Invention

The invention relates to a touch system and method, and more particularly to a touch system and recognition method for an optical inputting type touch panel.

2. Description of the Related Art

With technological development, increased human machine interface functions in electronic products are being demanded. The display monitor with human machine interface not only displays information, but also provides a touch function. Thus, a user can interact with the display monitor and utilize fingers or a pen such as a dummy pen, static pen or an optical pen, to control the display monitor configured to receive at least one input type selected from the group consisting of capacitive, resistive, infrared, electromagnetic, optical, and surface acoustic wave touch screen. The touch screen may be employed as an input device with many types of apparatus, but any type of touch panel is sensitive to and degraded by moisture, heat, ultra-violet radiation and so on, especially optical inputting type touch panel. Because the radiation is impinged directly to the surface of the touch panel, the degradation is more influenced on the input signal.

A problem which is common to the optical inputting type touch panel, and not addressed by the prior art, is monitor aging caused by limited lifetime of the monitor. Monitor aging makes the photo-sensor generate unexpected sensing signals weaker than the normal ones, and appear as invalid touch signal to the system. Specially speaking, a plurality of photo-sensors configured inside the monitor, and converted the ambient light to electrical signal as background current. The background current may be declined as time pass by in view of the gradual decay of photo-sensors. Referring to FIG. 8 is a characteristic diagram of a photo-sensor, illustrating the relationship between the light response of the photo-sensors sensed by the displaying monitor and the operation time of the monitor. The background light maintains an output voltage at a stable level such that the signal response is sensitive enough to determine whether an input optical signal is light or shadow. The curve 81 is constituted by a series of sensing signals measured in constant illumination condition of ambient light, with operation time of the display device is increased, the sensing signal generated from the photo-sensors array in the display device will decrease. When the touch panel aging happened, the sensing signal contained background information for position coordinate(s) may be incorrect such that the valid input signal is ignored.

Accordingly, the system will fail to determine the valid touch signal, and this problem is more serious with the aging of the display monitor. It is therefore desirable to have a recognition mechanism that is able to calibrate the aging occurred in the optical inputting type touch panel during the normal operation.

BRIEF SUMMARY OF THE INVENTION

An exemplary embodiment of a touch system comprises a touch panel and a readout circuit. The touch panel is integrated with a plurality of photosensitive elements within pixel elements, and capable of displaying at least touch position by at least an optical inputting. The touch panel provides a signal data when the touch panel is touched. The readout circuit is configured to receive the signal data and comprises a transformation unit and a processing unit. The transformation unit generates a signal value based on the signal data and a transformation parameter. The processing unit executes a specific action when the signal value is less than a preset value.

Furthermore, the present invention provides a recognition method for an optical inputting type touch panel comprising a plurality of photosensitive elements to sense an optical input by an user. The method comprises providing a signal value represented a light level of the optical inputting type touch panel; comparing the signal value with a preset value; and executing a specific action when the signal value is less than the preset value.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

An optical inputting type touch panel is a displaying monitor consisting of photo sensitive elements formed by optic-electrical character materials, which exhibit two operating modes, depending on their charge condition. These two modes are, firstly, input light sensing via light source (commonly referred to as an "optical touch") and, secondly, input light interrupting by an object (commonly referred to as a "finger touch"). Different operating modes of the optical inputting type touch panel are available to be selected, because driver circuits are used to control the selection of individual mode. In what follows, an optical touch of activating photo sensitive elements will be taken for example owing to simplicity.

It would have been known by ordinary skilled in the art that leakage current of amorphous silicon thin film transistors (a-Si TFTs) is sensitive to light, so a-Si TFTs are used to form photodiodes or photosensitive transistors etc serving as photo sensors. The photo-sensors are arranged in the array, and include a plurality of first conductive lines extending in parallel with each other, a plurality of second conductive lines extending in parallel with each other and being orthogonal to the plurality of first conductive lines. Each of the photo sensors is disposed near the intersection of one of the plurality of first conductive and one of the plurality of the second conductive lines, comprising a photosensitive transistor capable of detecting an optical signal including an image component and a background component and converting the optical signal into an image current and a background current corresponding to the background component.

Figure 1:
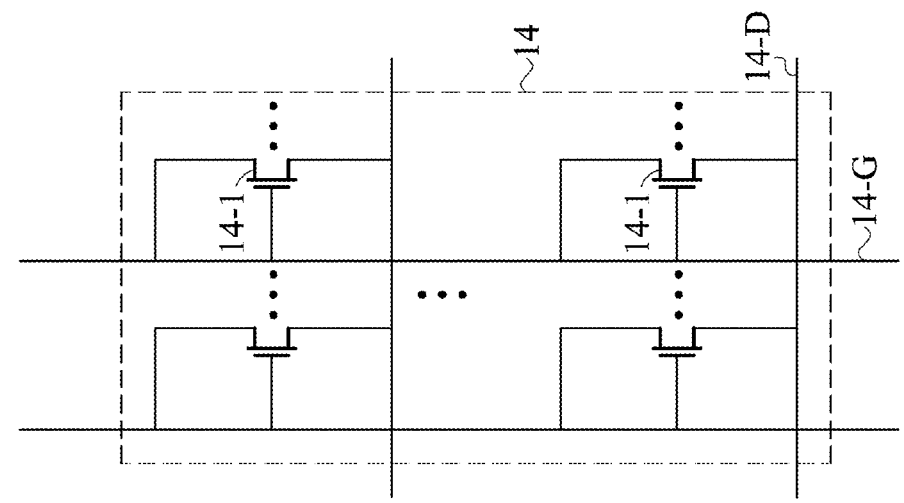
FIG. 1 is a schematic circuit diagram of a photo sensor array consistent with an embodiment of the present invention.

FIG. 1 is a schematic circuit diagram of a photosensitive transistor array consistent with an embodiment of the present invention. Referring to FIG. 1, the photosensitive transistor array 14 may include a plurality of photosensitive transistors 14-1 formed in rows and columns. A representative photosensitive transistor 14-1 is disposed near an intersection of one of a plurality of gate lines 14-G and one of a plurality of data lines 14-D orthogonal to the gate lines 14-G.

Figure 2:
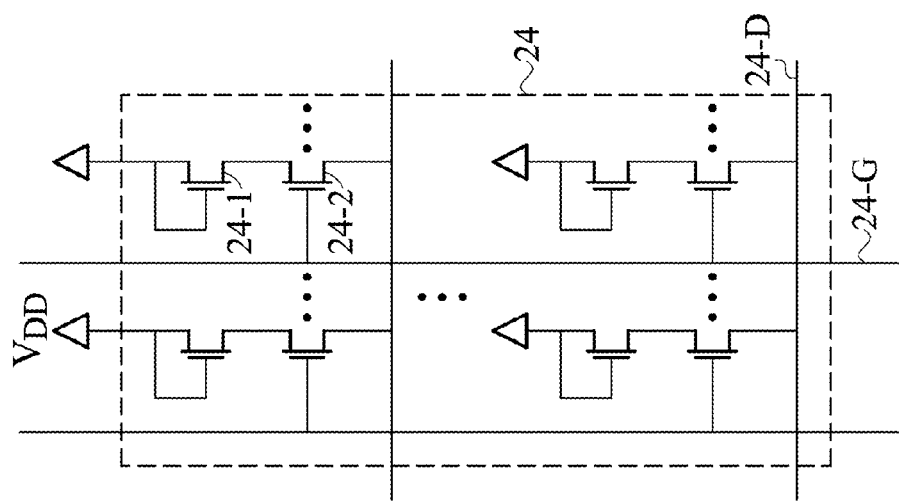
FIG. 2 is a schematic diagram of a photo sensor array consistent with another embodiment of the present invention.

FIG. 2 is a schematic diagram of a photosensitive transistor array consistent with another embodiment of the present invention. Referring to FIG. 2, the photosensitive transistor array 24 may include a plurality of photosensitive transistors 24-1 and a plurality of switching transistors 24-2 formed in rows and columns. A representative photosensitive transistor 24-1 and a representative switching transistor 24-2 are disposed near an intersection of one of a plurality of gate lines 24-G and one of a plurality of data lines 24-D orthogonal to the gate lines 24-G. The photosensitive transistor 24-1 may include a gate (not numbered) coupled to its drain, and a source (not numbered). Skilled persons in the art will understand that the drain and source of a transistor may be exchangeable, depending on the voltage levels to which they are connected. The switching transistor 24-2 may include a drain (not numbered) coupled to the source of the photosensitive transistor 24-1, a source (not numbered) coupled to one data line 24-D, and a gate (not numbered) coupled to one gate line 24-G.

Figure 3:
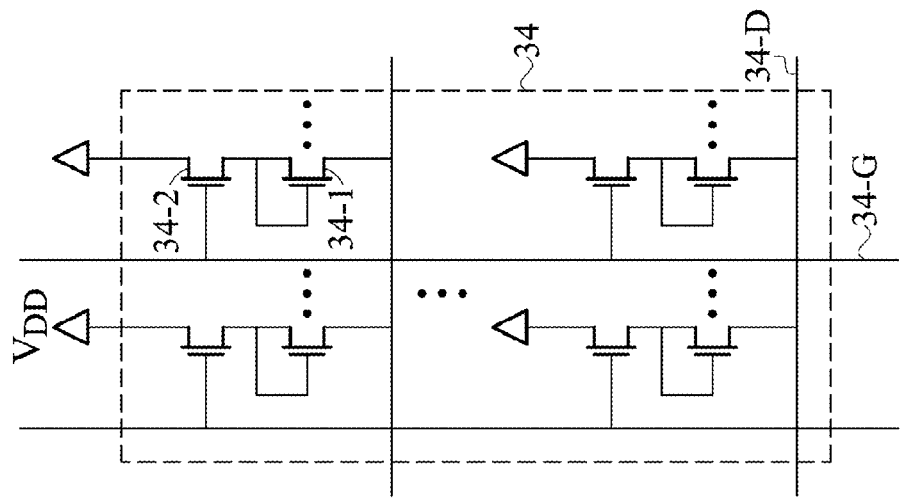
FIG. 3 is a schematic diagram of a photo sensor array consistent with still another embodiment of the present invention.

FIG. 3 is a schematic diagram of a photosensitive transistor array consistent with still another embodiment of the present invention. Referring to FIG. 3, the photosensitive transistor array 34 may include a plurality of photosensitive transistors 34-1 and a plurality of switching transistors 34-2 formed in rows and columns. A representative photosensitive transistor 34-1 and a representative switching transistor 34-2 are disposed near an intersection of one of a plurality of gate lines 34-G and one of a plurality of data lines 34-D orthogonal to the gate lines 34-G. The switching transistor 34-2 may include a gate (not numbered) coupled to one gate line 34-G, a drain (not numbered) coupled to the $V_{DD}$, and a source (not numbered). The photosensitive transistor 34-1 may include a drain (not numbered) coupled to the source of the switching transistor 34-2, a source (not numbered) coupled to one data line 34-D, and a gate (not numbered) coupled to its drain.

Furthermore, in the absence of an input optical signal, a light source such as an optical pen, a pressure source such as a force applied from a dummy stylus or fingertip, or even the shadow of an object, only the background light will be detected by the photosensitive transistor. The background light is converted to a photo current (Ib), which is generally a relatively small current. In the presence of an input optical signal, the photosensitive transistor generates a current I, including an image current (Im) due to the input optical signal and the photo current (Ib) due to the background light.

Figure 4:
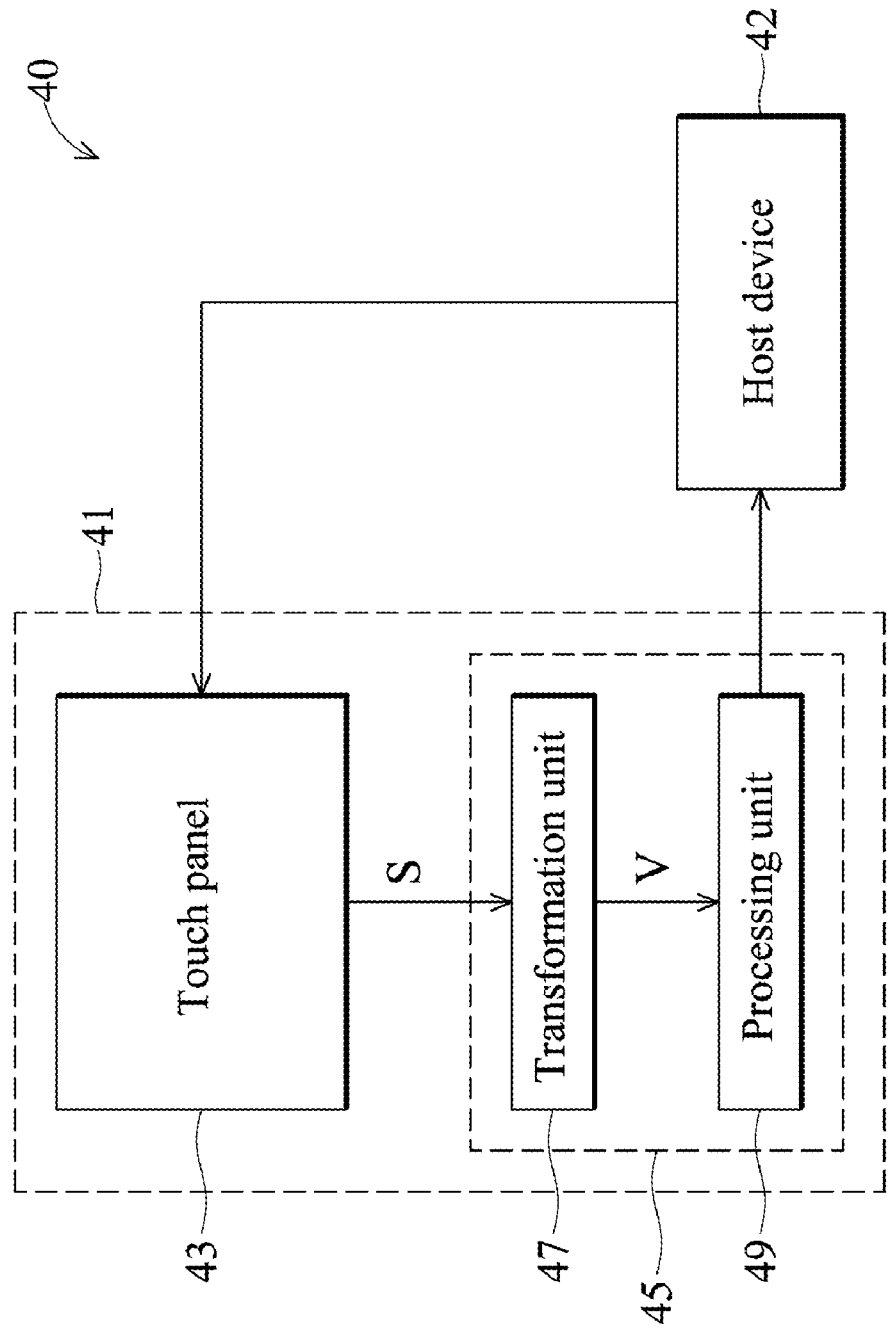
FIG. 4 is a schematic diagram of an exemplary embodiment of an touch system according to the invention.

FIG. 4 is a schematic diagram of an exemplary embodiment of a touch system according to the invention. The touch system 40 comprises a display device 41 and a host device 42. The touch system 40 can be a desktop computer, a notebook computer, or a mobile device, but the disclosure is not limited thereto. The display device 41 comprises a touch panel 43 and a control module 45. The touch panel 43 has pixel elements arranged in a first matrix and photosensitive elements (e.g. the photosensitive transistor array 14, 24 or 34) integrated in a second matrix within the first matrix. In other words, the touch panel 43 allows the optical input function of photosensitive elements be incorporated into a display device without complicating fabrication process or significantly increasing the fabrication cost. Example consistent with the present invention may provide a touch panel capable of storing input information in a capacitor before the information is subsequently read. As another example, some touch panel design may sense and output the information of touch position without capacitor storing.

The exemplary photosensitive element of the present invention may comprise a photo sensitive thin film transistor interconnected to a readout thin film transistor, but not limited therefore. No matter what type photosensitive element within the touch panel 43, it may include gate terminal connected to a corresponding gate line and one terminal coupled to a corresponding data line. When photosensitive element is activated by a gate line, current would flow from the photosensitive element to indicate the illumination level detected by the photosensitive element, and be referred to as a sensing signal. In one embodiment, all sensing signals of each data line could be gathered into a single signal data S, and outputted to control module 45, but the disclosure is not limited thereto. When an object (fingers or an optical pen) touches the touch panel 43, the information of touch location has contained in the signal data S, and is determined by comparing a current difference between the touch location and non-touch location of the display surface.

In this embodiment, the control module 45 is coupled to the touch panel 43 to receive the signal data S and comprises a transformation unit 47 and a processing unit 49. The transformation unit 47 of the present invention processes the signal data S to generate a signal value V. In other embodiments, if the touch panel 43 provides signal data $S_1$~Sn, the transformation unit 47 processes the signal data $S_1$~Sn to generate signal values $V_1$~Vn. The transformation unit 47 can be an analog-to-digital converter (ADC) capable of transforming the signal data S in an analog format form into a digital format form, and the digital form is referred as the signal value V.

The processing unit 49 determines the signal value V. In one embodiment, if the signal value V is less than a preset value, the processing unit 49 adjusts the next signal value or adjusts the present signal value V. In another embodiment, the transformation unit 47 also has ability to shift the magnitude of signal data S when the signal value V is not satisfied with a preset value predetermined by the processing unit 49. The shift level may be a constant or dynamitic value according to the internal setting of the processing unit 49.

For example, when a signal data S is obviously deviated from a preset value, the transformation unit 47 provides a wide shift to a next signal data. On the contrary, the transformation unit 47 shifts the next signal data slightly when the present signal value is close to the preset value. It is noted that the transformation unit 47 may be integrated within the touch panel 43, and the touch panel output the signal value V in the digital form.

The processing unit 49 of the present invention receives the digital signal value V, and tells the difference between the signal value V and an internal value referred as a preset value P. Since the photosensitive elements are periodically driven in accordance with the frame rate of the touch panel 43, an individual signal value V is obtained in each frame, for instance, a first signal value V1 at the first frame time, a second signal value V2 at the second frame time, and so on. Consequently, the signal value V provided from the transformation unit 47 at each frame time converted from all sensing signals of the embedded photosensitive elements within in the touch panel 43. In addition, the processing unit 49 has ability of analyzing digital signals, and determining whether a first signal value V1 is fallen in the range of the preset value predetermined therein or not. The first signal value is chosen from the signal values, and represents the signal value V of each frame time. Meanwhile, the following signal value (e.g. V2, V3, . . . , Vn) can serve as the representative signal value V, depending on individual condition. Thereinafter, the first signal value or the representative signal value is shortly referred as the signal value V.

Figure 5:
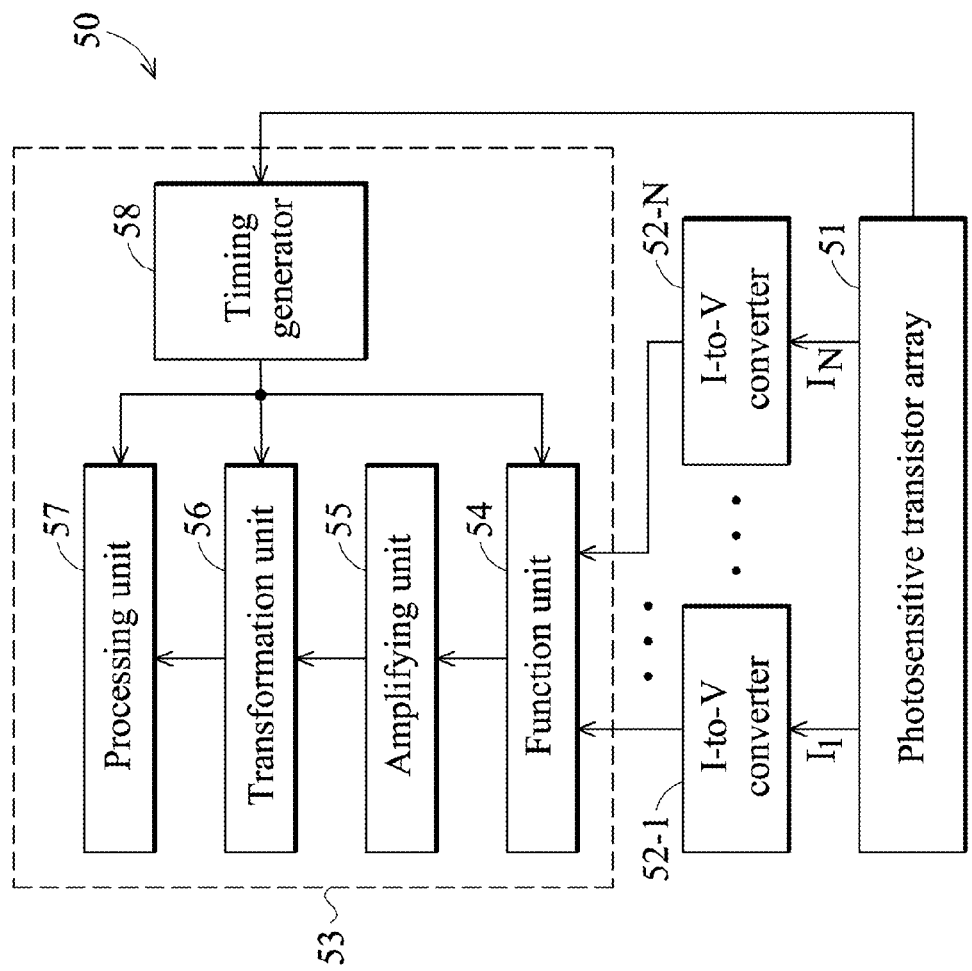
FIG. 5 is a schematic diagram of another exemplary embodiment of an touch system according to the invention.

FIG. 5 is a schematic diagram of another exemplary embodiment of a touch system according to the invention. The touch system 50 includes a photosensitive transistor array 51, a plurality of current-to-voltage converters 52-1 to 52-N, N being a natural number, and a readout circuit 53. The current-to-voltage converters 52-1 to 52-N can be omitted if the photosensitive transistor array 51 is capable of converting current-to-voltage. The readout circuit 53 may include a function unit 54, an amplifying unit 55, a transformation unit 56, a processing unit 57 and a timing generator 58. The function unit 54 may provide a voltage signal from the converters 52-1 to 52-N to the amplifying unit 55 in a sequential order. The voltage signal may be amplified in the amplifying unit 55 and then sampled in the transformation unit 56. The processing unit 57 may determine the coordinates of an optical input that causes a photo current based on an information from the transformation unit 56. The timing generator 58 is able to synchronize the operations of the function unit 54, the transformation unit 56 and the processing unit 57 based on synchronous signals used in the photosensitive transistor array 51 for gate synchronization. The readout circuit 53 in one example may be formed in integrated circuits, which may facilitate the fabrication of the touch system 50.

Figure 6:
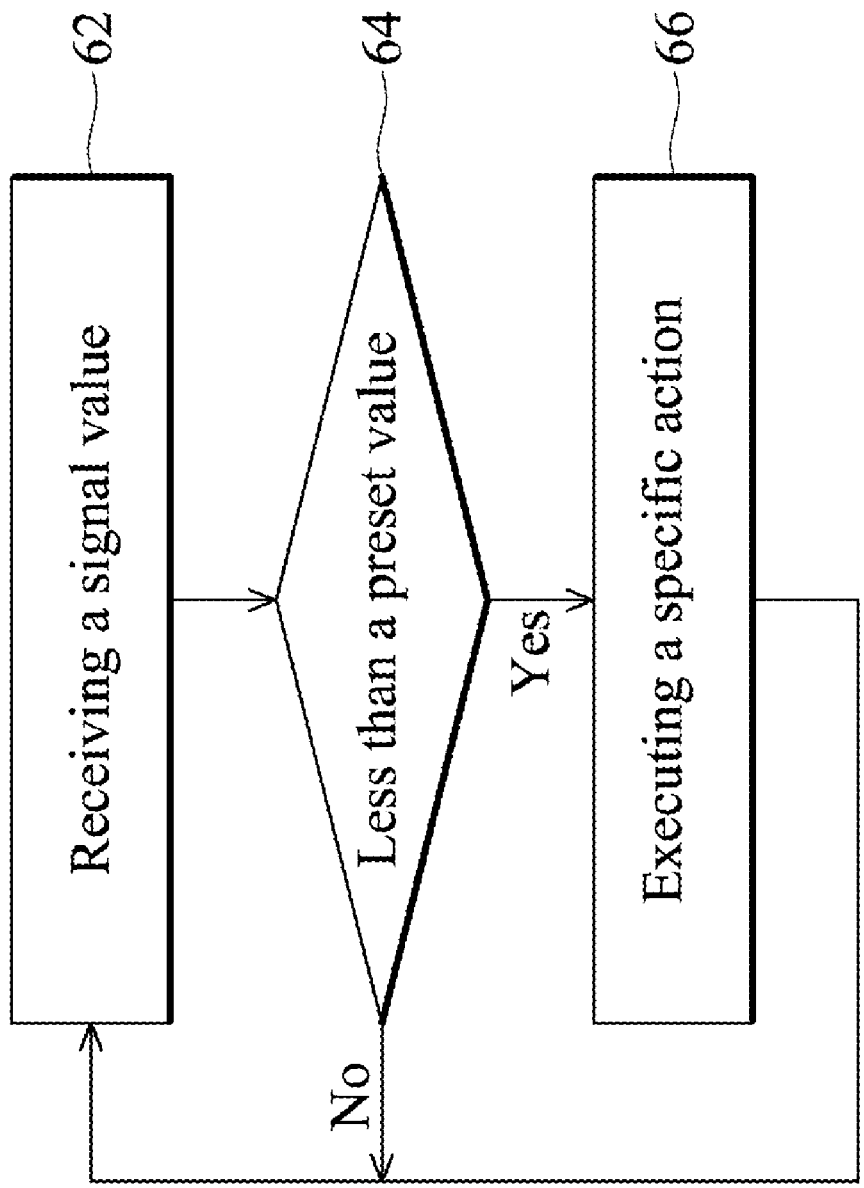
FIG. 6 is a flow diagram illustrating a logic process of the recognition mechanism during operating the touch system.

FIG. 6 is a flow diagram of an exemplary embodiment of a recognition method according to the invention. The recognition method checks whether the aging of the touch panel exists. Take a simplified example, the checking time point is usually regular, it means that the checking duration time is a constant. A signal value (e.g. V) is received (in step 62), the signal value V may be a virgin digital value or a modulated digital value. In this embodiment, a determination loop is executed to compare the signal value V with a preset value P. Referring to the preset value P, it may be a constant value. For example, the minimum of the signal value provided from the touch panel 43 is served as a preset value P. Whether the touch panel 43 receives an optical input or not, the sensing signal S detected by the photo sensor is impossible to be smaller than the minimum value of the sensing signal data. Due to the presence of the ambient light, the signal data S is a positive value when no touch is imposed. That means the signal value provided from the touch panel 43 is obtained in the condition of no touch input in dark room, and the signal value is served as a preset value P. In other words, the preset value P is on the basis of the background component in the dark condition.

Alternatively, the preset value P is dynamic for particular purpose in other embodiments. For example, the preset value P is gradually increased in order to calibrate the aging of the display device. It is not excluded the possibility that the preset value P is gradually decreased as time passes for the other purpose. The method for fixing or changing the preset value P is well known to those skilled in the art, the description is omitted for brevity.

As described above, the preset value P can be a minimum signal value represents the ambient light in the frame. Next, in step 64 of FIG. 6, the signal value V is determined whether to less than the preset value P. In the initial stage of the touch panel lifetime, the touch panel 43 does not have the aging problem. The sensing signals detected by the touch panel 43 are valid without any calibration. However, if the signal value is less than the preset value (V<P), as shown in step 66, a specific action is executed. The adjusting method of the signal value will be described in detail thereafter. In one embodiment, the specific action is to enhance the following signal values (e.g. V2~Vn) to prevent from missing valid input of the touch panel 43. In another embodiment, the specific action is to enhance the present signal value V. In other embodiments, the specific action is to adjust the transformation parameter of a transformation unit 47. For example, the specific action is to output a feedback to the transformation unit 47 and the feedback is an offset or a gain value. The feedback may be within a limited range of the touch panel lifetime. In this case, the transformation unit 47 is capable of providing an enhanced signal value.

Taking FIG. 4 as an example, for saving resource of the touch system 40, the processing unit 49 may set an internal timer to periodically check the signal value V generated from the transformation unit 47. Alternatively, the period time set in the internal timer could be dynamitic according to the degradation degree. Referring back to FIG. 5, the internal timer (not shown) is disposed in the processing unit 57, and its function is also different from the timing generator 58. The checking duration time of the internal timer incorporated in the processing unit 57 may be continuous (e.g. each frame), but the non-continuous (e.g. several seconds or minutes) checking duration time is preferred. In some example, the processing unit 57 checks the signal value regularly, and the checking duration time is fixed before the lifetime of the touch panel is ended. In another example, the checking duration time is inverse proportional to the magnitude of the shift level. When the signal value V is obviously deviated from the preset value, the processing unit 57 decreases the checking duration time automatically.

Figure 7:
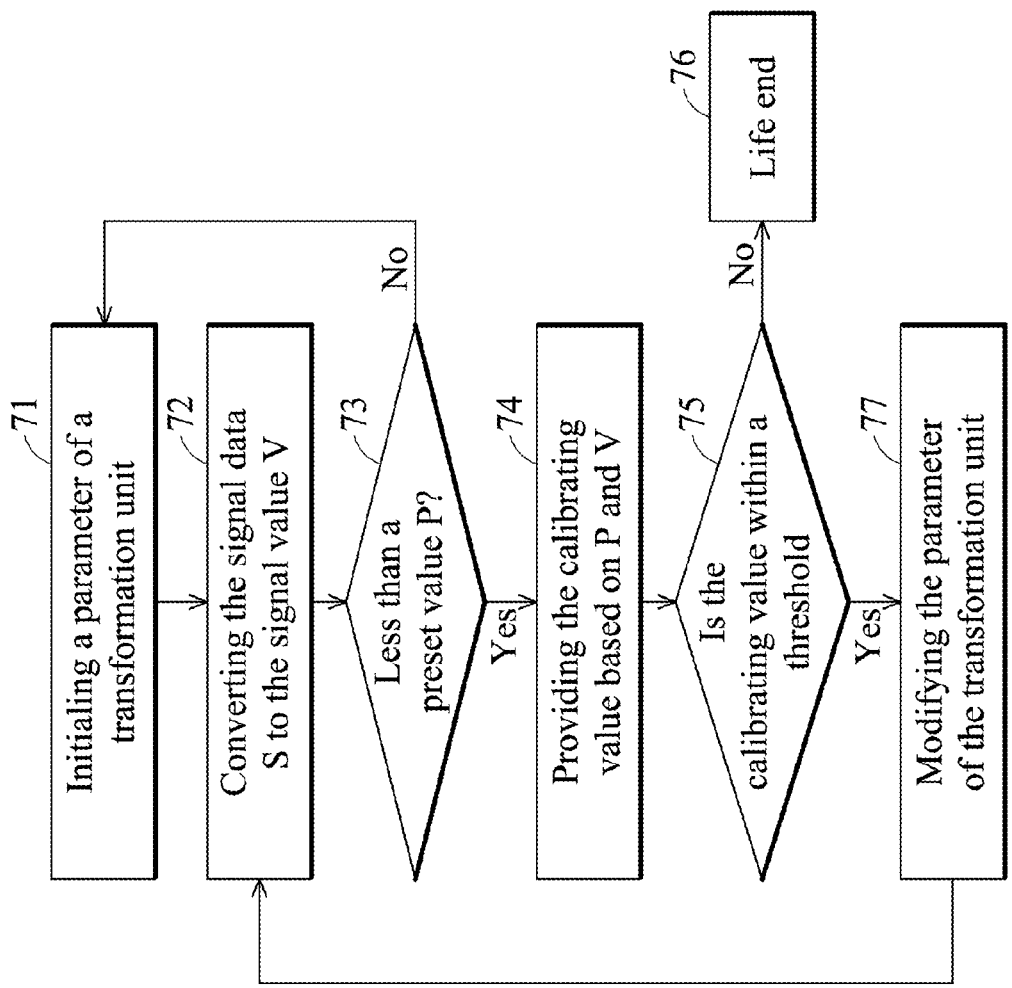
FIG. 7 is a flow diagram illustrating a logic process of the control module during operating the touch panel.
Figure 8:
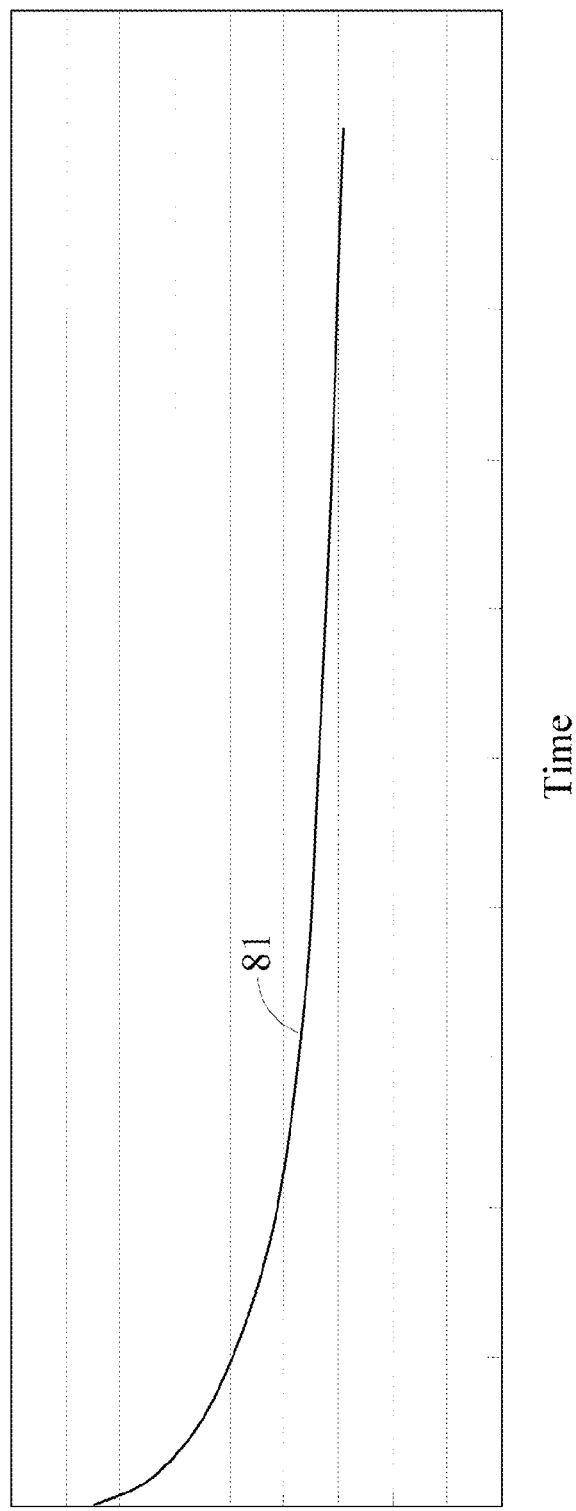
FIG. 8 is a characteristic diagram of a photo-sensor illustrating the relationship between the electrical signal sensed by the displaying monitor and the operation time of the monitor.

FIG. 7 is a flow diagram of another exemplary embodiment of a recognition method according to the invention. The recognition method could calibrate the aging occurred in an optical inputting type touch panel. The touch panel comprises a plurality of photosensitive elements to sense an optical input operated by an user. The parameter of a transformation unit is initialed in step 71. Taking FIG. 4 as an example, the control module 45 includes a transformation unit 47 for processing analog signal and a processing unit 49 capable of recognizing the abnormal signal value V. Generally speaking, the signal value V outputted from transformation unit 47 are required in digital format, and the parameter of the transformation unit 47 is initialized, as shown in step 71. In step 72, the analog signal data S is converted to the signal value V in digital form. In one embodiment, the signal value V is modulated based on the parameter estimated by the transformation unit 47. Then, the signal value V is compared with a preset value P in the processing unit 49, as shown in step 73. If the signal value V is not less than the preset value P, step 71 is executed to process the next signal value with the initial parameter in the transformation unit or the same parameter of the signal value V.

An adjusting loop is executed when the signal value V is less than the preset value P. The difference between the signal value V and the preset value P is recorded in step 74. Taking FIG. 4 as example, during operating the optical inputting type touch panel, the processing unit 49 records the calibrating value (P-V) between the signal value V and the preset value P, and reports the P-V value to the transformation unit 47, as shown in step 74. Meanwhile, the transformation unit 47 is required to determine whether the calibrating value is within a threshold or not (in step 75). Once the parameter of the transformation unit 47 is out of a limited range of the threshold, the touch panel 43 is arrived an operating life end, as shown in step 76. Generally speaking, the display pixel element of the touch panel is damaged before the lifetime of the embedded photo-sensor. In step 77, the parameter of the transformation unit 47 is modified in accordance with the P-V value, and the modified parameter of the transformation unit 47 provided based on the calibrating value shifts the signal values in following frames. In normal condition, the transformation unit 47 adjusts slightly the parameter by adding an offset value if the P-V value is in the range of the predetermined level. Alternatively, the parameter is modified by a gain value when the serious degradation happened, for example, a serial of signal value V is lower than the preset value P.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical inputting type touch system, comprising:
   a touch panel integrated with a plurality of photosensitive elements within pixel elements, and capable of displaying at least touch position by at least an optical inputting, wherein the touch panel provides a signal data generated by the photosensitive elements when the touch panel is touched;
   a readout circuit configured to receive the signal data and comprising:
      a transformation unit generating a signal value based on the signal data and a transformation parameter; and
      a processing unit, when the signal value is less than the preset value, returning a command to the transformation unit to shift a following signal value in accordance with the difference between the signal value and the preset value until the transformation unit receives a next command.

2. The optical inputting type touch system as claimed in claim 1, wherein the signal data is analog form and the signal value is digital format.

3. The optical inputting type touch system as claimed in claim 1, wherein the processing unit returns the command to adjust the transformation parameter.

4. The optical inputting type touch system as claimed in claim 1, wherein the command is an offset or a gain value.

5. The optical inputting type touch system as claimed in claim 1, wherein the command is a feedback and the feedback is within a limited range of the touch panel lifetime.

6. The optical inputting type touch system as claimed in claim 1, wherein the preset value is on the basis of a background component in a dark condition.

7. The optical inputting type touch system as claimed in claim 1, further comprising a plurality of converters disposed between the touch panel and the readout circuit and capable of converting a current of the optical inputting to a part of signal data.

8. The optical inputting type touch system as claimed in claim 1, wherein the signal data includes a background component of an ambient light and a photo component of optical inputting.

9. A feedback control method for an optical inputting type touch panel comprising a plurality of photosensitive elements to sense an optical input by an user, comprising:
   providing a signal value generated by the photosensitive elements to represent a light level of the optical inputting type touch panel;
   comparing the signal value with a preset value; and
   when the signal value is less than the preset value, returning a command to shift a following signal value in accordance with a difference between the signal value and the preset value until receiving a next command.

10. The feedback control method as claimed in claim 9, wherein the preset value is a constant.

11. The feedback control method as claimed in claim 9, wherein the signal value comprises photo component sensed by an embedded element in the optical inputting type touch panel.

12. The feedback control method as claimed in claim 9, wherein the command is within a limited range of the optical inputting type touch panel.

13. The feedback control method as claimed in claim 9, wherein the light level is ambient light illumination without optical inputting.

14. The feedback control method as claimed in claim 9, further comprising: defining the preset value according to information of a dark condition.

15. The feedback control method as claimed in claim 9, further comprising:
   discarding the signal value when the preset value is larger than the signal value, and shifting next signal values based on the difference between the preset value and the selected signal value.

16. The feedback control method as claimed in claim 9, further comprising:
   outputting the signal value to a host device.

* * * * *